PIEOELECTRIC CERAMIC

Filed Dec. 6, 1967 2 Sheets-Sheet 1

INVENTORS
NORIO TSUBOUCHI
MASAO TAKAHASHI
TOMEJI OHNO
TSUNEO AKASHI
BY
Hopgood & Calimafde
ATTORNEYS

INVENTORS
NORIO TSUBOUCHI
MASAO TAKAHASHI
TOMEJI OHNO
TSUNEO AKASHI

Hopgood & Calimafde
ATTORNEYS 3,487,019

PIEZOELECTRIC CERAMIC

Norio Tsubouchi, Masao Takahashi, Tomeji Ohno, and Tsuneo Akashi, Tokyo-to, Japan, assignors to Nippon Electric Company, Limited, Tokyo, Japan Filed Dec. 6, 1967, Ser. No. 688,431
Claims priority, application Japan, Dec. 8, 1966, 41/80,567
Int. Cl. C04b *35/64, 35/48*
U.S. Cl. 252—62.9 1 Claim

ABSTRACT OF THE DISCLOSURE

A piezoelectric ceramic is provided consisting essentially of a solid solution of the three components $$Pb(Fe_{1/2}Sb_{1/2})O,\ PbTiO_3 \text{ and } PbZrO_3$$

This invention relates to piezoelectric materials and more particularly to novel piezoelectric ceramics having excellent properties suitable for use in particular fields.

One of the typical fields of application of piezoelectric materials is manufacture of transducers for transmitting and receiving ultrasonic waves. In this case, the electromechanical coupling factor is the most essential measure for evaluating in practice the properties of piezoelectric materials to be used. The electromechanical coupling factor is a representative of the efficiency of transforming the electric oscillation into mechanical vibration and of conversely transforming the mechanical vibration into electrical oscillation, greater value thereof standing for better efficiency of interconversion and being desired for piezoelectric materials to be used in manufacture of transducers.

Piezoelectric materials have some other fundamental factors, such as dielectric loss, dielectric constant and mechanical quality factor, serving for evaluation thereof. As for piezoelectric materials for use in transducers, the dielectric loss is desired to be small, the desirable value of the dielectric constant being large or small depending on electric loads, the mechanical quality factor being not two imporant.

The above matters are described in detail in, for example, D. Berlincourt et al., "Transducer Properties of Lead Titanate Zirconate Ceramics," IRE Transactions of Ultrasonic Engineering, February 1960, pp. 1–6 and R. C. V. Macario, "Design Data for Band-Pass Ladder Filters Employing Ceramic Resonators," Electronic Engineering, vol. 33, No. 3 (1961), pp. 171–177.

It has been often true, however, that conventional piezoelectric ceramics, for example, barium titanate ($BaTiO_3$) and lead titanate zirconate [$Pb(Ti{\cdot}Zr)O_3$] have a small electromechanical coupling factor and are unfit for the practical use. Improvement of this factor has been made only by way of incorporating various additional constituents into the ceramics.

The object of this invention is to provide novel piezoelectric ceramics having the large electromechanical coupling factor.

The other object of this invention is to provide a novel piezoelectric ceramics suited for use in particular fields such as manufacture of transducers for transmitting and receiving ultrasonic waves.

This invention is based on the new discovery that the ceramic compositions consisting essentially of a solid solution of $Pb(Fe_{1/2}Sb_{1/2})O_3$-$PbTiO_3$-$PbZrO_3$ ternary system exhibit excellent piezoelectric activity and hence have practical utility.

The above ceramic compositions contain lead (Pb) as a divalent metallic element and also titanium (Ti) and zirconium (Zr) as tetravalent metallic elements. Moreover, the element iron (Fe) and the element antimony (Sb) are contained in such a proportion that they may be, as a whole, substantially equivalent to a tetravalent metallic element.

With regard to that ceramic material of the ternary system $Pb(Fe_{1/2}Sb_{1/2})O_3$ - $PbTiO_3$ - $PbZrO_3$ represented by the compositional formula $$[Pb(Fe_{1/2}Sb_{1/2})O_3]_x[PbTiO_3]_y[PbZrO_3]_z$$

where $x$, $y$ or $z$ is the mol ratio of each component and $x+y+z=1.00$, it has been found that the compositions should be restricted in view of its effective properties within the range determined by the following combination of the mol ratios $x$, $y$ and $z$:

| x | y | z |
|---|---|---|
| 0.01 | 0.51 | 0.48 |
| 0.01 | 0.09 | 0.90 |
| 0.10 | 0.00 | 0.90 |
| 0.40 | 0.00 | 0.60 |
| 0.40 | 0.30 | 0.30 |
| 0.30 | 0.50 | 0.20 |
| 0.10 | 0.60 | 0.30 |

Among the conventional piezoelectric ceramics, known is a ceramic solid solution of the $$Pb(Mg_{1/3}Nb_{2/3})O_3\text{-}PbTiO_3\text{-}PbZrO_3$$

ternary system, which is disclosed in the United States Patent 3,268,453 granted Aug. 23, 1966 to H. Ouchi et al. This conventional ceramic material, however, does not improve by itself the piezoelectric properties of the previous $PbTiO_3$-$PbZrO_3$ ceramics, and an excellent piezoelectric ceramic material is obtained only by adding thereto at least one of oxides of manganese, cobalt, nickel, iron and chromium as additional constituents up to 3 weight percent. In contrast, the $Pb,Fe_{1/2}Sb_{1/2})O_3$-$PbTiO_3$-$PbZrO_3$ composition of this invention remarkably improves the piezoelectric properties by itself (i.e. without any additional constituent). This difference in improvement of piezoelectric properties between the conventional compositions and the novel compositions of this invention is, it is believed, due to the fact that the conventional compositions use magnesium (Mg), an element belonging to the Group II–A in the periodic table, in conjunction with a group V–B element niobium (Nb), while in the composition of this invention a Group VIII element iron (Fe) is used in conjunction with a Group V–A element antimony (Sb).

Excellent piezoelectric activities of the ceramic compositions of this invention will be apparent from the following more particular description of preferred examples of this invention, as illustrated in the accompanying drawings.

EXAMPLES

Powdered materials of lead monoxide (PbO), ferric oxide ($Fe_2O_3$), antimony sesquioxide ($Sb_2O_3$), titanium dioxide ($TiO_2$), and zirconium dioxide ($ZrO_2$) were used as starting materials to obtain the $$Pb(Fe_{1/2}Sb_{1/2})O_3\text{-}PbTiO_3\text{-}PbZrO_3$$

ceramics of this invention, unless otherwise stated. These powdered materials were proportioned so that the final specimens had the compositions shown in Table 1. Here, antimony sesquioxide ($Sb_2O_3$) was weighed as calculated on the basis of antimony pentoxide ($Sb_2O_5$). In addition, the powder of lead monoxide, titanium dioxide and zirconium dioxide were weighed to obtain the conventional lead titanate zirconate ceramics having the compositional proportions shown in Table 2.

The respective powders were mixed in a ball mill with distilled water. The mixed powders were subjected to filtration, dried, crushed, then pre-sintered at 900° C. for one hour, and again crushed. Thereafter, the mixtures, with a small amount of distilled water being added thereto, were press-molded into discs of 20 mm. in diameter at a pressure of 700 kg./cm.$^2$ and sintered in an atmosphere of lead monoxide (PbO) for one hour at a temperature between 1260° C. and 1300° C. The resulting ceramic discs were polished on both surfaces to the thickness of one millimeter, provided with silver electrode on both surfaces, and thereafter piezoelectrically activated through the polarization treatment at room temperature or at 100° C. for one hour under an applied D.C. electric field of 30 to 50 kv./cm.

After the ceramic discs had been allowed to stand for 24 hours, the electromechanical coupling factor for the radial mode vibration ($k_r$) and the mechanical quality factor ($Q_m$) were measured to evaluate the piezoelectric activities. The measurement of these piezoelectric properties was made according to the IRE standard circuit. The value of $k_r$ was calculated by the resonant to antiresonant frequency method. The dielectric constant ($\epsilon$) and the dielectric loss (tan $\delta$) were also measured at a frequency of 1 kHz.

Tables 1 and 2 show typical results obtained. The results are for such specimens among those subjected to polarization treatment under the above-mentioned various conditions that have the greatest $k_r$ values. In the tables, the specimens are arranged according to the content of $PbTiO_3$ and there are also listed several values of Curie temperature which was determined through measurement of temperature variation in the dielectric constant ($\epsilon$). The novel compositions of the specimens of Table 1 are shown with black points in FIG. 1, while the conventional compositions of the specimens of Table 2 are indicated by crosses in the same figure.

Figure 2:
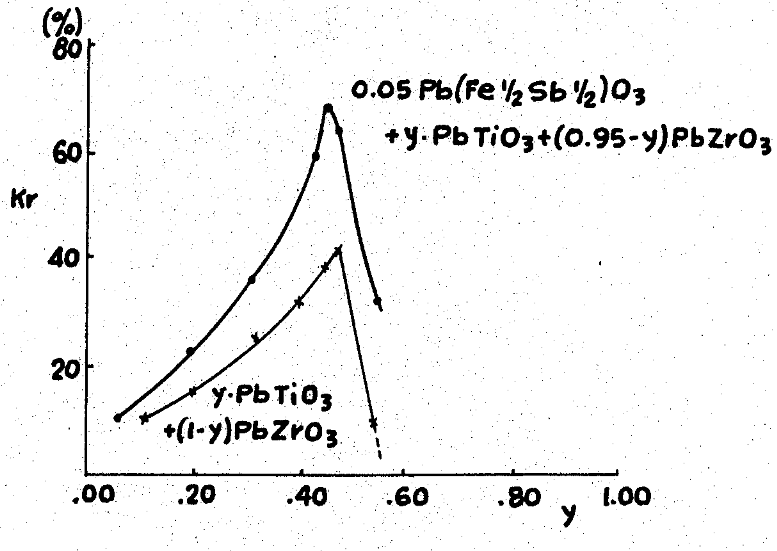
FIG. 2 depicts two curves showing the electromechanical coupling factors of both the conventional lead titanate zirconate ceramics and the ceramics of this invention, as a function of compositional change of lead titanate and lead zirconate in both the ceramics.

Comparison of the results for the specimens Nos. 10 and 13 of Table 1 with those for the specimen No. 4 of Table 2 will reveal that the greatest $k_r$ values of the novel ceramics of this invention are far superior to the maximum $k_r$ value of the conventional lead titanate zirconate ceramics which have been known as the most excellent piezoelectric ceramic material. Moreover, comparison of the results in Table 1 with those in Table 2, particularly between the novel and conventional ceramics in which the ratios of the contents of $PbTiO_3$ and $PbZrO_3$ are similar to each other, will also indicate that the ceramics of this invention have a remarkably improved $k_r$ value. This latter fact will be more clearly understood from FIG. 2, wherein the curve of a thick line represents the $k_r$ values of a novel ceramic material containing 5 mol percent of $Pb(Fe_{1/2}Sb_{1/2})O_3$, the varying content $y$ of $PbTiO_3$ and the remaining content of $PbZrO_3$, while the curve of a fine line shows the $k_r$ values of a conventional lead titanate zirconate ceramic material with the varying content $y$ of $PbTiO_3$.

As is seen from the above, this invention provides the excellent, useful piezoelectric ceramics having superior piezoelectric activities.

Figure 1:
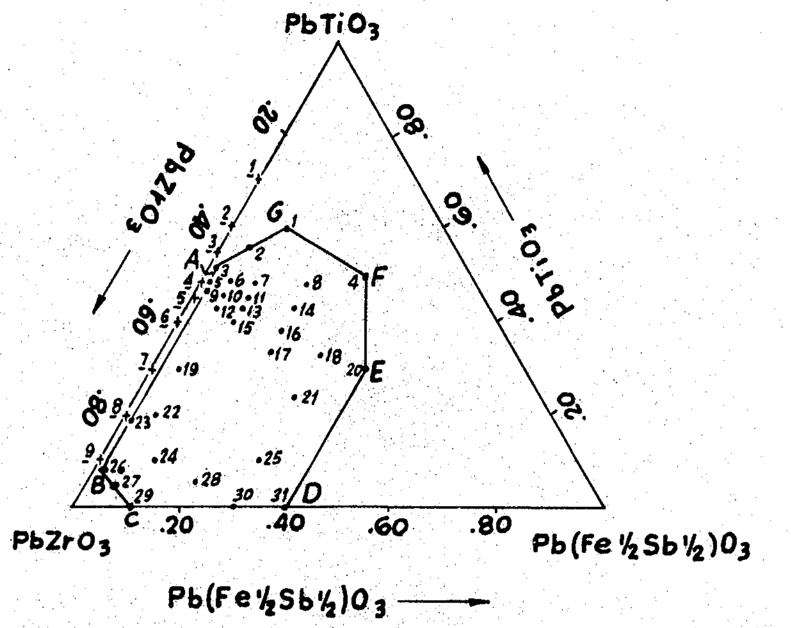
FIG. 1 is the triangular compositional diagram of the ternary system $Pb(Fe_{1/2}Sb_{1/2})O_3$-$PbTi_3$-$PbZrO_3$ showing both the effective ranges of the compositions of this invention and the specific compositions of the examples.

In the novel ceramics of $$Pb(Fe_{1/2}Sb_{1/2})O_3\text{-}PbTiO_3\text{-}PbZrO_3$$

ternary system of this invention, the superior piezoelectric activities as mentioned above are available only when the composition represented by the formula $$[Pb(Fe_{1/2}Sb_{1/2})O_3]x[PbTiO_3]y[PbZrO_3]z$$

where $x$, $y$ and $z$ represent a set of mol ratios and $x+y+z=1.00$, falls within the area A–B–C–D–E–F–G of FIG. 1 of the drawing. The sets of mol ratios of the vertices of the above area are as follows:

| | $x$ | $y$ | $z$ |
|---|---|---|---|
| A | 0.01 | 0.51 | 0.48 |
| B | 0.01 | 0.09 | 0.90 |
| C | 0.10 | 0.00 | 0.90 |
| D | 0.40 | 0.00 | 0.60 |
| E | 0.40 | 0.30 | 0.30 |
| F | 0.30 | 0.50 | 0.20 |
| G | 0.10 | 0.60 | 0.30 |

In case the content of $Pb(Fe_{1/2}Sb_{1/2})O_3$ is less than that falling within the above-mentioned area, it becomes impossible to complete the sintering in manufacture of the ceramics and besides the piezoelectric activities of the ceramics obtained are inferior to or nearly equal to those of the conventional lead titanate zirconate ceramics or otherwise, even if improved, insufficient for pratical use. If the content of $Pb(Fe_{1/2}Sb_{1/2})O_3$ is more than that falling within the above-mentioned area, accomplishment of the sintering is difficult and a uniform solid solution of the three components is not obtainable, with the result that the piezoelectric activities of the ceramics deteriorate to make the practical use impossible. Where the content of $PbTiO_3$ is outside the above-mentioned area, it is difficult to sinter a dense ceramics and the product has no practicable piezoelectric activities. Finally, in case the content of $PbZrO_3$ does not fall within the above-mentioned area, there results unuseful piezoelectric ceramics having markedly inferior piezoelectric activities.

In view of the above, it is determined that the ceramics of this invention, if required to apply to a practical use, should have the compositions falling within the area specified above. The ceramics of the effective compositions show excellent piezoelectric activities and have a high Curie temperature, as shown in Table 1, so that the piezoelectric activities may not be lost up to elevated temperature.

Figure 3:
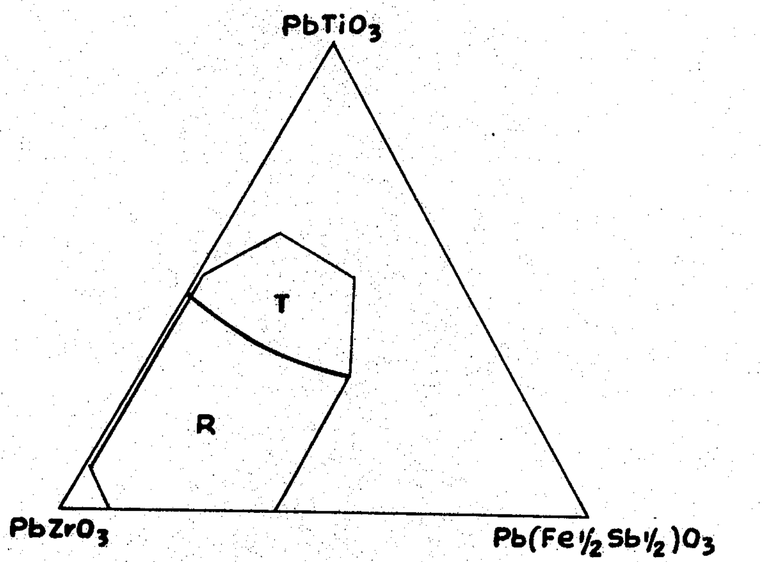
FIG. 3 is illustrative of the phase diagram of the ternary system of this invention.

The ternary system of $Pb(Fe_{1/2}Sb_{1/2})O_3$, $PbTiO_3$ and $PbZrO_3$ of this invention exists in a solid solution in greater parts of compositions and such a solid solution has a perovskite-type crystalline structure. FIG. 3 shows the crystalline phases of the ceramic compositions falling within the area A–B–C–D–E–F–G of FIG. 1 as determined at room temperature by the powder method of X-ray analysis. These compositions have a perovskite-type crystalline structure and belong to either the tetragonal phase (indicated by "T" in the figure) or the rhombohedral phase (indicated by "R"). The morphotropic phase boundary is shown with a thick line in the figure. In general, the value of $k_r$ is the greatest in the vicinity of this phase boundary.

It will be apparent that the starting materials to be used in manufacture of the ceramics of this invention are not limited to those used in the above examples. In detail, those oxides may be used instead of any starting material of the above examples, which are easily decomposed at elevated temperature to form a required composition, as exemplified by $Pb_3O_4$ for PbO in the examples. Also, those salts such as oxalates (as exemplified by $FeC_2O_4$ for $Fe_2O_3$ in the examples) or carbonates may be used instead of the oxides used in the examples, which are easily decomposed into the respective oxides at elevated temperature. Otherwise, hydroxides of the same character as above may be used instead of the oxides. Moreover, excellent piezoelectric ceramics having similar properties to the above examples are still also obtainable by preparing separately powdered material of each of $$Pb(Fe_{1/2}Sb_{1/2}O)_3$$

$PbTiO_3$ and $PbZrO_3$ in advance and by using them as starting materials to be mixed subsequently.

It is usual that zirconium dioxide ($ZrO_2$) available in the market contains several percent of hafnium dioxide ($HfO_2$). Accordingly, the ceramic compositions of this invention are allowed to contain small amount of such oxide or element as existing in the materials available in the market. Moreover, it is presumable that addition of a small amount of some additional agent to the ceramic compositions of this invention may further improve the piezoelectric properties, from the similar fact recognized in the conventional lead titanate zirconate ceramics. It will be understood from the foregoing that the ceramic compositions of this invention may include appropriate additives.

While there have been described what at present are believed to be the preferred examples of this invention, it will be obvious that various modifications can be made therein without departing from the scope of this invention and that this invention covers all the ceramic compositions as specified in the appended claim.

TABLE 1

| No. | Mol ratio of composition: $Pb(Fe_{1/2}Sb_{1/2})O_3$ $x$ | $PbTiO_3$ $y$ | $PbZrO_3$ $z$ | $k_r$ (percent) | $Q_m$ | $\epsilon$ | Tan $\delta$ (percent) | Curie temp. (°C.) |
|---|---|---|---|---|---|---|---|---|
| 1 | 0.10 | 0.60 | 0.30 | 20 | 80 | 310 | 3.1 | ------ |
| 2 | 0.05 | 0.55 | 0.40 | 30 | 70 | 440 | 4.4 | ------ |
| 3 | 0.01 | 0.51 | 0.48 | 32 | 180 | 820 | 1.2 | ------ |
| 4 | 0.30 | 0.50 | 0.20 | 11 | 300 | 430 | 6.4 | ------ |
| 5 | 0.01 | 0.48 | 0.51 | 44 | 200 | 1030 | 0.8 | ------ |
| 6 | 0.05 | 0.48 | 0.47 | 62 | 110 | 660 | 2.1 | ------ |
| 7* | 0.10 | 0.48 | 0.42 | 37 | 140 | 820 | 2.0 | ------ |
| 8 | 0.20 | 0.48 | 0.32 | 17 | 280 | 800 | 2.2 | ------ |
| 9 | 0.02 | 0.47 | 0.51 | 57 | 230 | 1350 | 2.4 | ------ |
| 10 | 0.05 | 0.46 | 0.49 | 68 | 290 | 880 | 1.8 | 320 |
| 11 | 0.10 | 0.45 | 0.45 | 57 | 210 | 1520 | 2.8 | ------ |
| 12 | 0.05 | 0.43 | 0.52 | 58 | 340 | 650 | 2.4 | ------ |
| 13 | 0.10 | 0.43 | 0.47 | 64 | 200 | 590 | 3.0 | 290 |
| 14 | 0.20 | 0.43 | 0.37 | 44 | 160 | 1580 | 2.6 | ------ |
| 15** | 0.10 | 0.40 | 0.50 | 54 | 170 | 620 | 3.5 | ------ |
| 16 | 0.20 | 0.38 | 0.42 | 49 | 160 | 1010 | 3.4 | 210 |
| 17* | 0.20 | 0.33 | 0.47 | 41 | 180 | 880 | 4.0 | ------ |
| 18 | 0.30 | 0.33 | 0.37 | 37 | 320 | 1520 | 5.7 | 150 |
| 19 | 0.05 | 0.30 | 0.65 | 35 | 420 | 370 | 2.6 | ------ |
| 20 | 0.40 | 0.30 | 0.30 | 9 | 70 | 2490 | 8.8 | ------ |
| 21* | 0.30 | 0.23 | 0.47 | 34 | 250 | 1220 | 4.3 | ------ |
| 22 | 0.05 | 0.20 | 0.75 | 22 | 610 | 340 | 2.8 | ------ |
| 23 | 0.01 | 0.19 | 0.80 | 20 | 490 | 320 | 1.8 | ------ |
| 24 | 0.10 | 0.10 | 0.80 | 19 | 540 | 330 | 4.6 | ------ |
| 25** | 0.30 | 0.10 | 0.60 | 23 | 360 | 1170 | 4.5 | ------ |
| 26 | 0.01 | 0.09 | 0.90 | 15 | 830 | 230 | 1.1 | ------ |
| 27 | 0.05 | 0.05 | 0.90 | 10 | 440 | 340 | 1.4 | ------ |
| 28 | 0.20 | 0.05 | 0.75 | 16 | 380 | 610 | 5.1 | ------ |
| 29 | 0.10 | 0.00 | 0.90 | 9 | 320 | 230 | 5.4 | ------ |
| 30 | 0.30 | 0.00 | 0.70 | 13 | 420 | 1150 | 4.5 | ------ |
| 31 | 0.40 | 0.00 | 0.60 | 5 | 180 | 4860 | 4.3 | ------ |

NOTE.—In manufacture of the specimens with a sole asterisk, triplumbic tetroxide ($Pb_3O_4$) was used instead of lead monoxide (PbO) as one of the starting materials. Also, for the specimens with double asterisks, ferrous oxalate ($FeC_2O_4$) was used instead of ferric oxide ($Fe_2O_3$).

TABLE 2

| No. | Mol ratio of composition: $PbTiO_3$ | $PbZrO_3$ | $k_r$ (percent) | $Q_m$ | $\epsilon$ | Tan $\delta$ (percent) |
|---|---|---|---|---|---|---|
| 1 | 0.70 | 0.30 | ------ | ------ | 340 | 5.7 |
| 2 | 0.60 | 0.40 | ------ | ------ | 300 | 2.4 |
| 3 | 0.55 | 0.45 | 8 | 30 | 350 | 1.3 |
| 4 | 0.48 | 0.52 | 42 | 250 | 1,060 | 1.6 |
| 5 | 0.45 | 0.55 | 38 | 290 | 640 | 3.0 |
| 6 | 0.40 | 0.60 | 30 | 320 | 460 | 3.1 |
| 7 | 0.30 | 0.70 | 24 | 380 | 380 | 3.3 |
| 8 | 0.20 | 0.80 | 15 | 470 | 350 | 3.3 |
| 9 | 0.10 | 0.90 | 10 | 580 | 280 | 3.4 |

NOTE.—For the specimens Nos. 1 and 2, the evaluation of piezoelectric activities was impossible.

What is claimed is:

1. A piezoelectric ceramic consisting essentially of the composition which is represented by the formula $$[Pb(Fe_{1/2}Sb_{1/2})O_3]_x[PbTiO_3]_y[PbZrO_3]_z$$

where $x$, $y$ and $z$ represent a set of mol ratios and $x+y+z=1.00$, and which falls within the area A–B–C–D–E–F–G of FIG. 1 of the drawing, the sets of mol ratios of the vertices of said area being as follows:

| | $x$ | $y$ | $z$ |
|---|---|---|---|
| A | 0.01 | 0.51 | 0.48 |
| B | 0.01 | 0.09 | 0.90 |
| C | 0.10 | 0.00 | 0.90 |
| D | 0.40 | 0.00 | 0.60 |
| E | 0.40 | 0.30 | 0.30 |
| F | 0.30 | 0.50 | 0.20 |
| G | 0.10 | 0.60 | 0.30 |

References Cited

Nomura et al.: "Chemical Abstracts," vol. 57, p. 4144f (1962).

TOBIAS E. LEVOW, Primary Examiner

J. COOPER, Assistant Examiner

U.S. Cl. X.R.

106—39